(12) United States Patent
Okabe et al.

(10) Patent No.: US 9,401,295 B2
(45) Date of Patent: Jul. 26, 2016

(54) LOAD PORT APPARATUS AND CLAMPING DEVICE TO BE USED FOR THE SAME

(75) Inventors: Tsutomu Okabe, Tokyo (JP); Hiroshi Igarashi, Tokyo (JP)

(73) Assignee: TDK Corporation, Tokyo (JP)

( * ) Notice: Subject to any disclaimer, the term of this patent is extended or adjusted under 35 U.S.C. 154(b) by 597 days.

(21) Appl. No.: 13/556,611

(22) Filed: Jul. 24, 2012

(65) Prior Publication Data

US 2013/0028688 A1 Jan. 31, 2013

(30) Foreign Application Priority Data

Jul. 29, 2011 (JP) ................................ 2011-166584

(51) Int. Cl.
*H01L 21/673* (2006.01)
*H01L 21/677* (2006.01)

(52) U.S. Cl.
CPC .... *H01L 21/67775* (2013.01); *H01L 21/67379* (2013.01)

(58) Field of Classification Search
CPC ..................... H01L 21/67379; H01L 21/67775
See application file for complete search history.

(56) References Cited

U.S. PATENT DOCUMENTS

| | | | |
|---|---|---|---|
| 7,621,714 B2 * | 11/2009 | Miyajima et al. | ............ 414/810 |
| 7,665,787 B2 | 2/2010 | Obayashi | |
| 7,927,058 B2 * | 4/2011 | Miyajima et al. | ........... 414/217.1 |
| 9,171,748 B2 * | 10/2015 | Hatano | ............. H01L 21/67379 |
| 2002/0044859 A1 * | 4/2002 | Lee et al. | ....................... 414/411 |
| 2002/0051701 A1 * | 5/2002 | Saeki et al. | .............. 414/222.01 |
| 2004/0089823 A1 * | 5/2004 | Harris | .......................... 250/559.4 |
| 2009/0241302 A1 * | 10/2009 | Natsume | ........................ 24/457 |

FOREIGN PATENT DOCUMENTS

| | | |
|---|---|---|
| JP | 2002-164412 | 6/2002 |
| JP | 2003-264211 A | 9/2003 |
| JP | 2005-209986 | 8/2005 |
| JP | 2006-114699 | 4/2006 |
| JP | 2012-64827 A | 3/2012 |

OTHER PUBLICATIONS

Office Action issued Jun. 20, 2013, in Japanese Patent Application No. 2011-166584 with English translation.

* cited by examiner

*Primary Examiner* — James Keenan

(74) *Attorney, Agent, or Firm* — Oblon, McClelland, Maier & Neustadt, L.L.P.

(57) ABSTRACT

To suppress deformation of a portion to be clamped even when a load applied to the portion to be clamped is increased at the time of fixing a front opening unified pod (FOUP), a clamping arm pivotable between a retracting position and a clamping position about a rotational axis inclined relative to a bottom surface of the FOUP is arranged. The clamping arm is housed in a housing depression so that the clamping arm at the retracting position is situated below a surface of a mount base, and at the clamping position, protrudes from the surface of the mount base and becomes engageable with the portion to be clamped.

10 Claims, 6 Drawing Sheets

LOAD PORT APPARATUS AND CLAMPING DEVICE TO BE USED FOR THE SAME

BACKGROUND OF THE INVENTION

1. Field of the Invention

The present invention relates to a so-called front-opening interface mechanical standard (FIMS) system, that is, a load port apparatus, which is used for transferring, from one semiconductor processing apparatus to another semiconductor processing apparatus, wafers held in a sealed-type transport container called a pod, or for transferring the wafers from the semiconductor processing apparatus to the pod, during a semiconductor manufacturing process and the like. Further, the present invention relates to a clamping device to be used for the load port apparatus when fixing the pod onto the load port apparatus.

2. Description of the Related Art

In recent years, in a general semiconductor manufacturing process, cleanliness is managed throughout the entire process by maintaining a highly clean state in only the following three spaces: inner spaces of various processing apparatus; an inner space of a pod capable of containing wafers and transporting the wafers from one processing apparatus to another processing apparatus; and a mini-environment in which the wafers are exchanged between the pod and the respective processing apparatus. Such a pod includes a main-unit portion which contains wafers therein and which has a wafer-insertion-and-removal opening formed in one side surface, and a lid which makes the inside of the pod serve as a sealed space by closing the opening. Further, a structure that defines the mini-environment includes an opening portion capable of facing the above-mentioned opening of the pod and a second opening portion arranged on the semiconductor processing apparatus side so as to face the opening portion.

The load port apparatus includes a member as a partition wall provided with the opening portion, that is, a wall called a side base, a door for closing the opening portion, a door drive mechanism for controlling operation of the door, and a mount base on which the pod is to be mounted. The mount base is capable of supporting the pod in such a manner that the opening of the pod and the opening portion face each other, and moving so as to bring the lid of the pod close to or apart from the door together with the pod itself. The door is capable of holding the lid of the pod. The door drive mechanism causes the door to open and close the opening portion under a state of holding the lid, and the door is caused to retract below a space between the opening portion and the second opening portion or to enter the space. A robot is arranged in the mini-environment, and the robot is capable of entering into and retracting from the inside of the pod through the opening portion and the opening of the pod, and transfers wafers between the inside of the pod and the semiconductor processing apparatus also through the second opening portion.

On the above-mentioned mount base, there is arranged a configuration for fixing the pod onto the mount base so as to prevent displacement of the mounted pod from a predetermined mount position at the time when the mount base is moved. For example, Japanese Patent Application Laid-Open No. 2005-209986 discloses a clamping unit for fixing the pod by protruding, after the pod is mounted, from a surface of the mount base, entering an engagement depression provided in a bottom surface of the pod, and engaging with a surface to be clamped, which is provided in the engagement depression. Further, Japanese Patent Application Laid-Open No. 2006-114699 discloses a clamping device, which is originally arranged in the surface of the mount base so as to protrude therefrom, and engages with the surface to be clamped of the engagement depression through a pivoting operation. Further, Japanese Patent Application Laid-Open No. 2002-164412 discloses a wafer transporting container mounting device including a mechanism in which, after the pod is mounted, a clamping portion protruding from the surface of the mount base engages with the surface to be clamped.

In the semiconductor manufacturing process, the use of wafers each having a larger diameter has been progressed for the purpose of productivity improvement or the like. Therefore, as the above-mentioned pod, mini-environment, and internal space of the processing apparatus, the use of a larger pod, mini-environment, and internal space has been progressed as well. In view of the above-mentioned pod clamping configuration of the conventional technology, the portion to be clamped is arranged in the bottom surface of the pod, and is provided as a plate-like member extending in parallel to the bottom surface of the pod. At the time of actually fixing and clamping the pod, the clamping portion applies, to the plate-like member, a load for urging the plate-like member vertically downward. When the pod is upsized, an inertial force generated when the pod is moved is also increased, and in order to resist the inertial force, the load applied by the clamping portion to the portion to be clamped is inevitably increased.

In the aspect of the pod configuration, the increase in thickness of the plate-like part of the portion to be clamped leads to increase in weight of the pod or in size of the configuration of the bottom portion of the pod, and thus it may be difficult to allow such increase in thickness. However, as described above, the load generated by the clamping portion is also inevitably increased, and hence, in the conventional configuration, the plate-like portion to be clamped may be deformed due to the increased load. Therefore, there is a demand for development of a clamping mechanism capable of achieving both increase in load and suppression of deformation of the portion to be clamped, which have originally been trade-off conditions.

SUMMARY OF THE INVENTION

The present invention has been made in view of the above-mentioned circumstances, and it is therefore an object of the present invention to provide a load port apparatus and a clamping device to be used suitably for the load port apparatus, which are capable of suppressing deformation of a portion to be clamped of a pod even when a load necessary to fix the pod is increased.

In order to solve the above-mentioned problem, according to an exemplary embodiment of the present invention, there is provided a load port apparatus, including: a mount base on which a pod is to be fixed, the pod including a pod main body having an opening formed in one side surface thereof, and a lid for opening and closing the pod through the opening, the pod being capable of containing an object to be contained therein, the lid being openable and closable so that the object to be contained is insertable into and removable from the pod; a clamping member pivotable between a retracting position and a clamping position about a rotational axis inclined at a predetermined angle relative to a bottom surface of the pod, the clamping member including a clamping portion abuttable against a portion to be clamped of the pod at the clamping position; and a housing depression having an internal space dimensioned so that the clamping member situated at the retracting position is housed therein and the clamping portion of the clamping member pivoted from the retracting position to the clamping position protrudes above the mount base, the housing depression being arranged in a surface of the mount base, the clamping member being arranged in the housing depression.

Note that, in the above-mentioned load port apparatus, it is preferred that the portion to be clamped be a depression provided in the bottom surface of the pod and opened at the bottom surface, and have a surface to be clamped, which gradually narrows an opening of the depression in a range from a bottom of the depression toward the opening of the depression, and that the clamping portion have a shape conforming to a shape of the surface to be clamped. Further, the clamping member is preferred to be a pair of clamping members. Further, it is more preferred that, in a cross section of the housing depression taken along a plane which includes the rotational axis and is perpendicular to the bottom surface of the pod, one of the pair of clamping members abut against one of opposing surfaces to be clamped, and another of the pair of clamping members abut against another of the opposing surfaces to be clamped. Further, it is more preferred that the clamping member include: a rod-like clamping arm having the clamping portion arranged on one side thereof, the rod-like clamping arm being supported to the rotational axis on another side thereof; and a clamping cylinder for rotating the rotational axis, and that the clamping cylinder be configured to perform an operation of drawing the rod-like clamping arm at the clamping position along the rotational axis.

Further, in order to solve the above-mentioned problem, according to an exemplary embodiment of the present invention, there is provided a clamping device to be used for a load port apparatus, the load port apparatus including a mount base on which a pod is to be fixed, the pod including a pod main body having an opening formed in one side surface thereof, and a lid for opening and closing the pod through the opening, the pod being capable of containing an object to be contained therein, the lid being openable and closable so that the object to be contained is insertable into and removable from the pod, the clamping device being configured to fix the pod onto the mount base, the clamping device including: a clamping member pivotable between a retracting position and a clamping position about a rotational axis inclined at a predetermined angle relative to a bottom surface of the pod, the clamping member including a clamping portion abuttable against a portion to be clamped of the pod at the clamping position; and a housing depression having an internal space dimensioned so that the clamping member situated at the retracting position is housed therein and the clamping portion of the clamping member pivoted from the retracting position to the clamping position protrudes above the mount base, the housing depression being arranged in a surface of the mount base, the clamping member being arranged in the housing depression.

Note that, in the above-mentioned clamping device, it is preferred that the portion to be clamped be a depression provided in the bottom surface of the pod and opened at the bottom surface, and have a surface to be clamped, which gradually narrows an opening of the depression in a range from a bottom of the depression toward the opening of the depression, and that the clamping portion have a shape conforming to a shape of the surface to be clamped. Further, the clamping member is preferred to be a pair of clamping members. Further, it is more preferred that, in a cross section of the housing depression taken along a plane which includes the rotational axis and is perpendicular to the bottom surface of the pod, one of the pair of clamping members abut against one of opposing surfaces to be clamped, and another of the pair of clamping members abut against another of the opposing surfaces to be clamped. Further, it is more preferred that the clamping member include: a rod-like clamping arm having the clamping portion arranged on one side thereof, the rod-like clamping arm being supported to the rotational axis on another side thereof; and a clamping cylinder for rotating the rotational axis, and that the clamping cylinder be configured to perform an operation of drawing the rod-like clamping arm at the clamping position along the rotational axis.

According to the present invention, the load necessary to fix the pod is, when being applied, dispersed in multiple directions in the portion to be clamped, and accordingly the rigidity of the portion to be clamped against the load is enhanced. Thus, the deformation of the portion to be clamped can be suppressed even when the load is increased.

Further features of the present invention will become apparent from the following description of exemplary embodiments (with reference to the attached drawings).

DESCRIPTION OF THE EMBODIMENTS

Figure 1A:
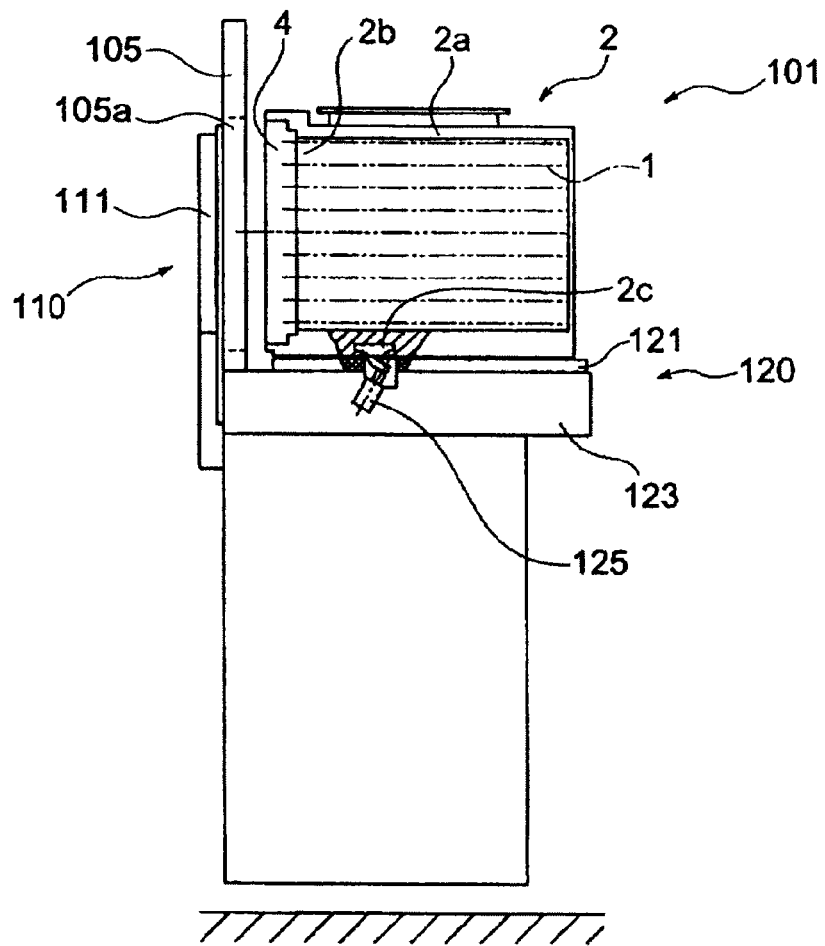
FIG. 1A is a side view illustrating a schematic configuration of a load port apparatus according to an embodiment of the present invention under a state in which a pod is mounted on a mount base.
Figure 1B:
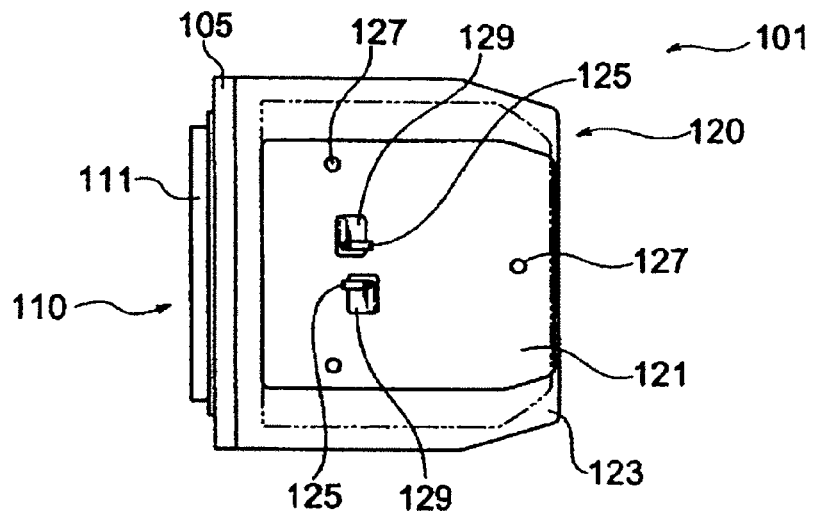
FIG. 1B is a top view illustrating the schematic configuration of the load port apparatus of FIG. 1A under a state in which the pod is not mounted.
Figure 2A:
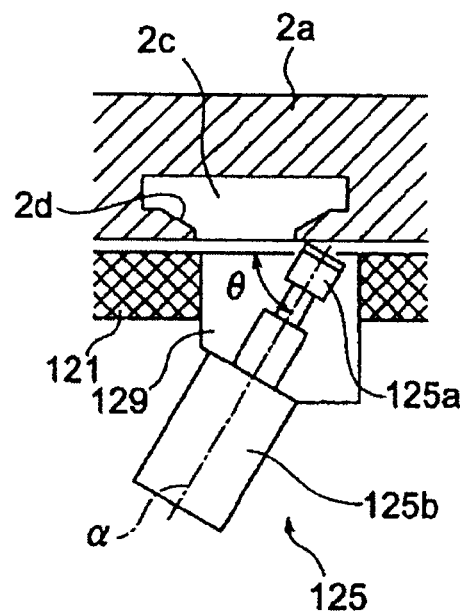
FIG. 2A is an enlarged view illustrating a configuration of a clamping member of FIG. 1A and its related components in an unclamped state.
Figure 2B:
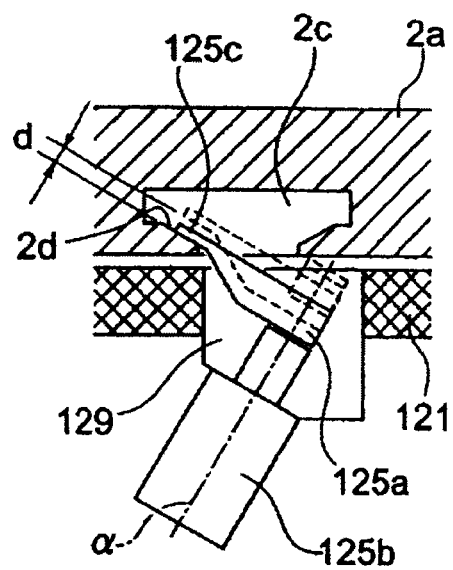
FIG. 2B is a view illustrating a state in which the pod is clamped in the configuration of FIG. 2A.
Figure 3A:
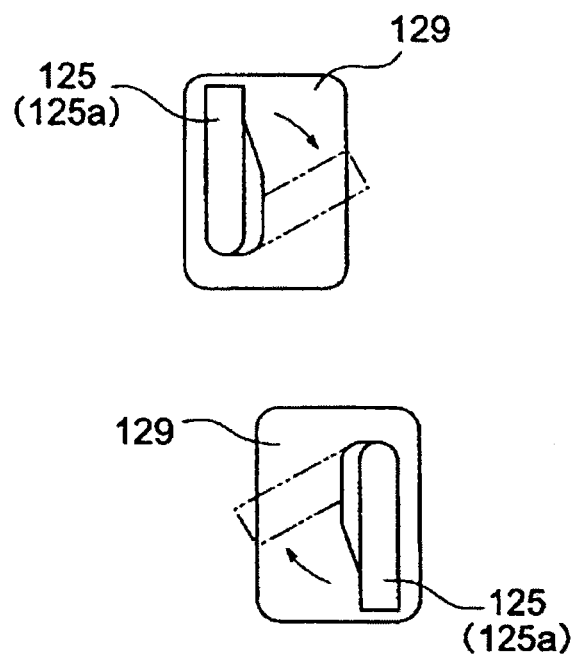
FIG. 3A is an enlarged view illustrating a configuration of the clamping members of FIG. 1B and their related components in the unclamped state.
Figure 3B:
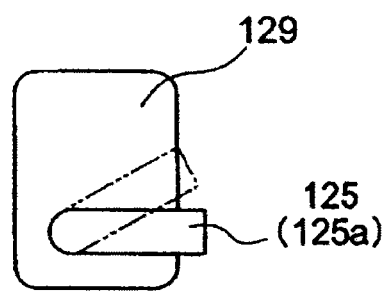
FIG. 3B is a view illustrating the state in which the pod is clamped in the configuration of FIG. 3A.
Figure 3B:
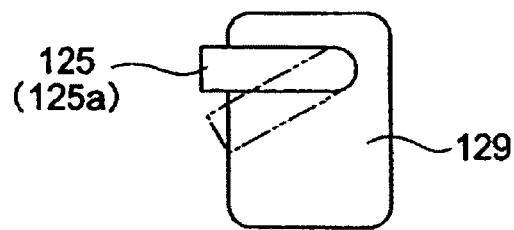

In the following, embodiments of the present invention are described with reference to the drawings. FIG. 1A is a side view illustrating a schematic configuration of a load port apparatus according to an embodiment of the present invention under a state in which a pod 2 is mounted on a mount base. Note that, FIG. 1A is a partially transparent view illustrating the configuration of a clamping member and its related components, which correspond to a feature of the load port apparatus according to the present invention. FIG. 1B is a top view illustrating the schematic configuration of the load port apparatus of FIG. 1A under a state in which the pod 2 is not mounted. FIGS. 2A and 2B are enlarged views illustrating the clamping member and its vicinity in a layout similar to that of FIG. 1A under a state in which the pod 2 is mounted on a mount base. FIG. 2A illustrates a state in which the pod is not fixed, and FIG. 2B illustrates a state in which the pod is fixed. FIGS. 3A and 3B are enlarged views illustrating the clamping members and their vicinities in a layout similar to that of FIG. 1B. FIG. 3A illustrates a state in which the pod is not fixed, and FIG. 3B illustrates a state in which the pod is fixed. In FIGS. 3A and 3B, a door 111 and the like are arranged on the left side of each drawing sheet, and the pod 2 is transferred onto a mount base 121 from the right side of each drawing sheet. Further, FIGS. 3A and 3B illustrate an example of an arrangement of containing depressions 129 as viewed from the viewpoint of FIG. 1B.

The pod to be mounted on the load port apparatus and wafers to be contained in the pod are described first. In a main body 2a of the pod 2, there is formed a space for housing therein wafers 1 as objects to be contained. The main body 2a has a substantially box-like shape in which an opening 2b is provided in any one surface thereof situated in a horizontal direction. Further, the pod 2 includes a lid 4 for sealing the opening 2b of the main body 2a. The pod 2 includes multiple stages of shelves (not shown) arranged therein, for superposing, in a vertical direction, the wafers 1 horizontally held in the main body 2a. The wafers 1 mounted on the shelves are contained in the pod 2 at regular intervals. The wafer 1 is defined as an object to be contained according to the present invention, and the pod 2 is defined as a component which includes the pod main body 2a having the opening 2b formed in one side surface thereof, and the lid 4 for opening and closing the pod 2 through the opening 2b, and is capable of containing the object to be contained therein. Further, in association with the above-mentioned configuration, the load port apparatus according to the present invention is intended to insert and remove the object to be contained into and from the pod main body 2a by opening and closing the lid 4 with respect to the opening 2b of the pod 2.

In a bottom surface of the pod 2, there is provided a portion 2c to be clamped, which has a depressed shape and is used for fixing the pod 2 onto the mount base through engagement with the clamping member described later. The portion 2c to be clamped includes a depression formed in a range from the bottom surface of the pod 2 toward the internal space of the pod 2, and a region to be clamped, which is provided on the bottom surface side of the pod 2 and projects from the periphery of the depression along the bottom surface of the pod so as to narrow the depression. In the region to be clamped, a tapered surface is formed so that an opening of the depression is gradually narrowed in a range from a bottom of the depression toward the opening of the depression. The tapered surface functions as a surface 2d to be clamped, which abuts against an abutment surface of the clamping member described later, to thereby fix and hold the pod 2 onto the mount base by the clamping member. That is, in the load port apparatus according to this embodiment, the portion 2c to be clamped is the depression provided in the bottom surface of the pod 2 and opened at this bottom surface, and has the surface 2d to be clamped, which gradually narrows the opening of the depression in the range from the bottom of the depression toward the opening of the depression.

Next, the configuration of the load port apparatus according to this embodiment is described below. A load port apparatus 101 includes a side plate 105, a pod mount portion 120, and a door system 110. The side plate 105 is mounted to a wall of a transportation room serving as a mini-environment in a semiconductor processing apparatus, in which the above-mentioned opening portion is arranged. The side plate 105 separates the transportation room serving as the mini-environment of the present invention from an external space in cooperation with the wall of the transportation room (wall of the load port apparatus 101 serving as a part of an outer wall of the semiconductor processing apparatus). Further, the side plate 105 has a first opening portion 105a, and the door system 110 is installed for the purpose of opening and closing the first opening portion 105a. The door system 110 causes the door 111 to open and close the first opening portion 105a, and a door drive mechanism (not shown) arranged below the pod mount portion 120 opens and closes the door 111.

The pod mount portion 120 is arranged adjacent to the side plate 105, and arranged on the external space side. The pod mount portion 120 includes the mount base 121, a mount base drive mechanism 123, and clamping members 125. The mount base 121 is formed of a plate-like member having a substantially flat surface, and the pod 2 is transferred onto the surface by an operator or a pod transportation apparatus. Further, on the surface of the mount base 121, there are arranged positioning pins 127 and the housing depressions 129 for housing the clamping members 125, respectively. When the positioning pins 127 are fitted into positioning depressions (not shown) arranged in the bottom surface of the pod 2, the pod 2 is mounted at a predetermined position on the surface of the mount base 121. Under the state in which the pod 2 is mounted, the opening 2b of the pod 2 faces the first opening portion 105a of the side plate 105. The mount base drive mechanism 123 supports the mount base 121, and brings the mount base 121 close to and apart from the side plate 105. When the mount base 121 comes close to the side plate 105, the lid 4 of the pod 2 substantially abuts against the door 111, and then the door 111 holds the lid 4 and opens the first opening portion 105a. Through this operation, the pod 2 is opened. Note that, the mount base drive mechanism 123 is constructed of a known linear slider and actuator. The mount base drive mechanism 123 is not particularly related to the main feature of the present invention, and description thereof is therefore omitted herein.

In this embodiment, as illustrated in FIGS. 2A and 2B, the clamping member 125 includes a clamping arm 125a and a clamping cylinder 125b. The clamping cylinder 125b has a shaft portion rotatable about a predetermined rotational axis "α", and at an end of a rotational stroke, a cylinder main body for driving the shaft portion draws the shaft portion by a predetermined amount "d" toward the cylinder main body along the rotational axis "α". The clamping arm 125a is supported at one end portion thereof to the shaft portion of the clamping cylinder 125b, and at another end portion thereof or in its vicinity, serves as a clamping portion 125c that abuts against the surface 2d to be clamped of the pod 2. The rotational axis "α" is not perpendicular but is inclined at a predetermined inclination angle "θ" relative to the bottom surface of the pod 2. Note that, in the present invention, the bottom surface of the pod 2 is defined by a plane in which the pod 2 is supported under a state in which the pod 2 is mounted on the mount base 121, that is, a plane parallel to a plane in which a lower edge of the opening 2b of the pod 2 moves when the mount base drive mechanism 123 moves the pod 2. Further, in this embodiment, the clamping portion 125c is defined by the end portion of the clamping arm 125a, but is not limited to the end portion as long as the clamping portion 125c is abuttable against the surface 2d to be clamped at a clamping position. For example, the clamping portion 125c may be arranged on one side of the rod-like clamping arm 125a. Further, in this case, it is preferably understood that the rod-like clamping arm 125a is supported on another side thereof to the rotational axis.

The clamping member 125 is arranged in the housing depression 129 that is provided in the surface of the mount base 121. The clamping member 125 is fixed to a bottom portion of the housing depression 129. In a retracting posture of FIG. 2A (initial position before a clamping operation is started, that is, position of an unclamped state), the clamping arm 125a is housed in the housing depression 129, and is situated below the bottom surface of the pod 2. In the present invention, the rotational axis "α" of the clamping arm 125a is set to have the inclination angle "θ" relative to the bottom surface of the pod 2. As illustrated in FIGS. 1B, 3A, and 3B, each housing depression 129 has a rectangular opening defined by long sides and short sides. The clamping arm 125a has a length that is smaller than the long side of the rectangle and larger than the short side thereof, and a rotational center of the clamping arm 125a about the clamping cylinder 125b is situated at a corner of the rectangle. Through the above-mentioned arrangement and setting of the inclination angle "θ" of the rotational axis "α", a part of the clamping arm 125a brought into a clamping posture through a rotational operation, in this case, the clamping portion 125c, can protrude from the housing depression 129. That is, the housing depression 129 is arranged in the surface of the mount base 121, and the clamping member 125 is arranged in the housing depression 129. Further, the housing depression 129 has an internal space dimensioned so that the clamping member 125 (clamping arm 125a) situated at the retracting position is housed therein and the clamping member 125 pivoted to the clamping position, in particular, the clamping portion 125c of the clamping member 125, protrudes above the mount base 121.

The dotted line of FIG. 2B indicates the clamping posture of the clamping portion 125c of the clamping arm 125a, that is, the state in which the clamping portion 125c of the clamping arm 125a protrudes outside the housing depression 129 through the rotation of the clamping arm 125a. The clamping posture is achieved at the terminal end of the rotational operation of the clamping arm 125a. Under this state, the clamping cylinder 125b performs a drawing operation by the predetermined amount "d" so that the clamping arm 125a moves to a position indicated by the solid line of FIG. 2B and the clamping portion 125c abuts against the surface 2d to be clamped, to thereby fix and clamp the pod 2 onto the mount base 121. That is, the clamping cylinder 125b performs an operation of drawing the clamping arm 125a at the clamping position along the rotational axis "α". In this embodiment, the surface 2d to be clamped of the above-mentioned portion 2c to be clamped, which is a tapered surface, is formed so as to be perpendicular to the rotational axis "α". The abutment surface of the clamping portion 125c against the surface 2d to be clamped is arranged in parallel to the surface 2d to be clamped, and those surfaces are brought into contact with each other through the drawing operation, with the result that the pod 2 is stably fixed onto the mount base 121.

Note that, a clamping load to be applied from the clamping portion 125c to the surface 2d to be clamped is obtained by relatively applying a force parallel to the rotational axis "α" to the clamping arm 125a. In this embodiment, the clamping load is obtained by a drawing force applied from the clamping cylinder 125b along the rotational axis "α". Note that, in this embodiment, from the viewpoint of suppressing sliding motion between the clamping portion 125c and the surface 2d to be clamped, the clamping arm 125a is drawn after the pivoting operation is finished. However, when a problem of dust to be generated along with the sliding motion is negligible due to, for example, selection of a material for the clamping arm 125a, the clamped state may be achieved simply through the pivoting operation. In this case, the clamping portion 125c only needs to abut against the surface 2d to be clamped at the terminal end of the pivoting operation, and hence, for example, the surface 2d to be clamped may be arranged so as not to be perpendicular to the rotational axis. However, also in this case, the clamping load is obtained by the force applied from the clamping cylinder 125b to the clamping arm 125a along the rotational axis "α".

As illustrated in FIGS. 1B, 3A, and 3B, in this embodiment, two clamping members 125 are arranged in pairs on the load port apparatus 101. Those clamping members 125 have the rotational axes "α", respectively, which are symmetric across an axis perpendicular to the bottom surface of the pod 2, and are rotatable in the same direction (in this embodiment, clockwise direction in the drawing sheet of FIG. 3A). The respective clamping arms 125a at standby positions are arranged along parallel axes so that the clamping portions 125c thereof are situated farthest from each other. Under the clamped state of FIG. 3B, the clamping arms 125a are parallel to each other. At this time, at the corresponding portions 2c to be clamped, the respective clamping portions 125c clamp the pod 2 on the surfaces 2d to be clamped, which are defined by tapered surfaces situated opposite to each other in a driving direction of the pod 2. In other words, in the clamping members 125 (and the housing depressions 129), the arrangements of the housing depressions 129, the arrangements of the clamping cylinders 125b, the arrangements of the clamping portions 125c, and the operational directions of the clamping arms 125a are point symmetric about a middle point between the respective rotational axes "α". Through those arrangements, the clamping members 125 respectively perform rotational movement so as to be opposed to each other.

Through the arrangement of the above-mentioned clamping member 125 on the load port apparatus 101, the tapered portion of the portion 2c to be clamped may be set as the surface 2d to be clamped. Thus, as compared to the conventional case where the load is applied only downward of the pod 2, the load necessary to fix the pod 2 can be, when being applied, dispersed in multiple directions in the region to be clamped (in this embodiment, force components in the horizontal direction and in the vertical direction are obtained). Accordingly, the rigidity of the region to be clamped can be enhanced and the deformation thereof can be suppressed. In particular, the load can be applied also in a direction in which the member of the pod main body 2a serving as the region to be clamped is relatively large in thickness (in this embodiment, horizontal direction), and hence the risk of deformation due to the load can be reduced. Further, the two clamping members 125 are arranged as described above, and hence the pod 2 is clamped through the application of loads opposite to each other in the moving direction of the pod 2. Thus, even when the pod 2 is upsized, the clamping load can be applied effectively to the pod 2. Further, through the arrangement of the pair of clamping members 125, it is possible to resist the moment of the force applied to the pod 2 along the horizontal direction. Further, with use of the rotary clamping cylinder that performs the drawing operation after the rotational operation, the sliding motion between the surface 2d to be clamped and the clamping portion 125c can be suppressed to the extent possible, and accordingly the generation of dust at the time of the clamping operation can be suppressed efficiently.

Figure 4A:
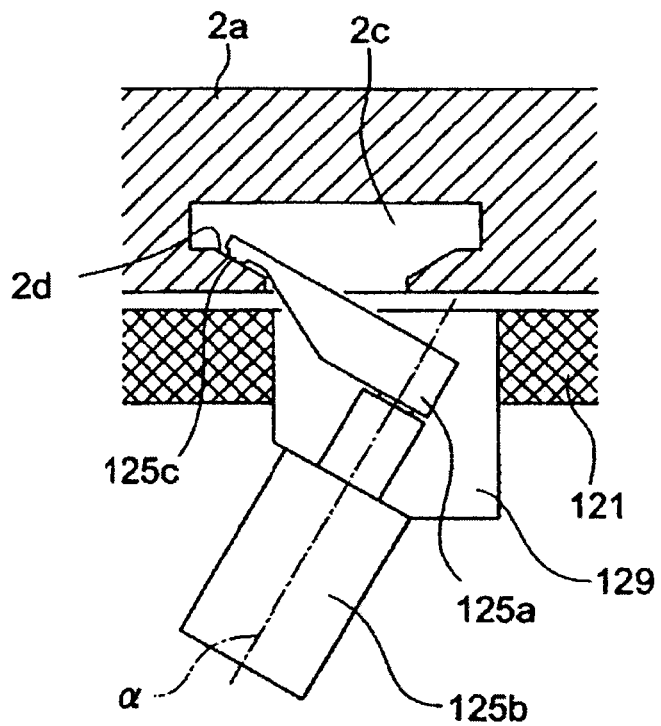
FIG. 4A is a schematic view illustrating a clamping arm according to a further embodiment of the present invention.
Figure 4B:
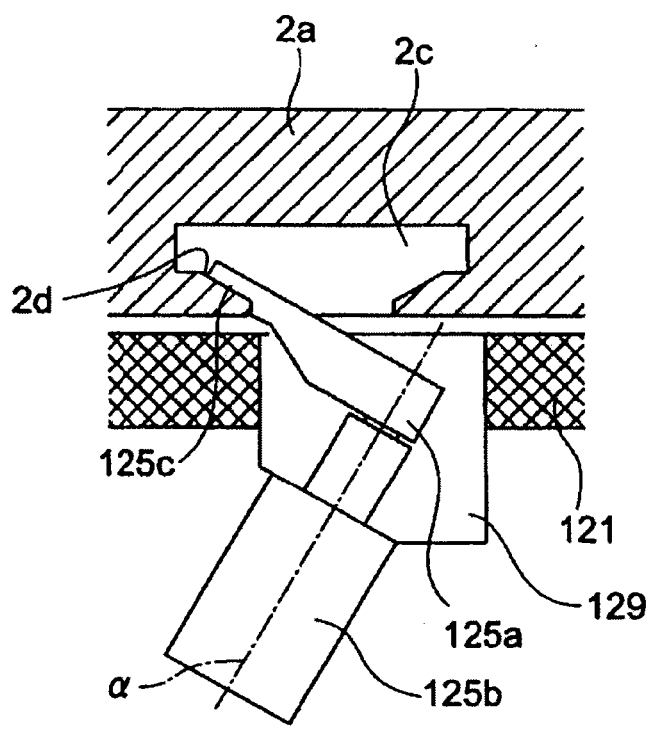
FIG. 4B is a schematic view illustrating a clamping arm according to a further embodiment of the present invention in a form different from the form of FIG. 4A.

Next, further embodiments of the present invention are described. FIGS. 4A and 4B illustrate a clamping arm 125a or a clamping portion 125c according to the further embodiments in a layout similar to that of FIG. 2B. Note that, the same components as those in the above-mentioned embodiment are represented by the same reference symbols, and description thereof is therefore omitted herein. In the embodiment of FIG. 4A, a hemispheric protrusion is arranged on the clamping portion 125c. According to this embodiment, even when, for example, the surface 2d to be clamped is not perpendicular to the rotational axis "α" or the surface 2d to be clamped is a rough surface, the pod 2 can be clamped through secure point contact. Thus, even when the surface 2d to be clamped is not defined by a plane inclined at a predetermined angle, partial wear or the like due to so-called partial contact of the clamping portion 125c can be prevented.

In the portion 2c to be clamped, a region having a constant maximum width or diameter, a region serving as the above-mentioned tapered surface, in which the width or diameter is gradually reduced, and a region having a constant minimum width or diameter are continuously arranged in an order from the bottom of the portion 2c to be clamped toward the opening portion thereof. As described above, in the embodiment of FIG. 1B and the like and the embodiment of FIG. 4A, the tapered surface is used as the surface 2d to be clamped. In the embodiment of FIG. 4B, the clamping portion 125c is shaped to have two stages. Specifically, a planar part corresponding to the above-mentioned clamping portion 125c abuts against the surface 2d to be clamped, and a step part provided continuously from the planar part of the clamping portion 125c abuts against the above-mentioned region which has a constant width or diameter and is connected to the opening portion. Thus, the step part of the clamping arm 125a restricts horizontal movement in a plane perpendicular to the bottom surface of the pod 2, and accordingly the portion 2c to be clamped is pressed in the moving direction of the pod 2. Components of a force for dismounting the pod 2 from the mount base 121 are applied in this moving direction. Due to the step part, even in the event of such an operation error that the pod 2 is to be moved during processing of the wafers 1 in the pod 2, the trouble of moving the pod 2 can be prevented securely.

Note that, in the above-mentioned clamping member 125, the clamping portion 125c of the clamping arm 125a is preferred to have any one shape of the above-mentioned embodiments, but the shape of the clamping portion 125c of the present invention is not limited to those of the above-mentioned embodiments. That is, it is preferred that the clamping portion 125c have a shape conforming to the shape of the surface 2d to be clamped. However, the present invention is not limited to the above-mentioned embodiments, and various modifications may be made thereto depending on the shape and configuration of the part of the portion 2c to be clamped, which is to be clamped by the clamping portion 125c. For example, in consideration of wear characteristics or the like, a different material may be used only for the part of the portion 2c to be clamped, which is to be brought into contact with the clamping portion 125c. Further, the present invention employs the clamping cylinder that performs two-step operations of pivoting and drawing, but alternatively, those operations may be performed at the same time or only the pivoting operation may be performed. Thus, a pivoting drive mechanism of various configurations may be employed.

In the above-mentioned embodiments, there is exemplified a configuration in which the clamping portions 125c of the pair of clamping members 125 in the standby posture are situated farthest from each other, and at the time of the clamping operation, both the clamping members 125 pivot in the same direction. Note that, those clamping members 125 are arranged so that their rotational axes "α" and rotations about the rotational axes "α" are point symmetric about a middle point between the housing depressions 129 for housing the clamping members 125, respectively. However, the arrangement and rotational direction of the pair of clamping members 125 are not limited to those of the above-mentioned embodiments. Hereinafter, other embodiments are exemplified with reference to the drawings. FIGS. 5A to 5D illustrate examples of the other embodiments in a layout similar to those of FIGS. 3A and 3B. Note that, in FIGS. 5A to 5D, the dotted lines each indicate a position of the clamping member 125 in the standby posture, and the solid lines each indicate a position of the clamping member 125 in the clamping posture. Further, the arrows of FIGS. 5A to 5D each indicate a pivoting direction of the clamping arm 125a toward the position of the clamping posture. The same components as those described above are represented by the same reference symbols.

Figure 5A:
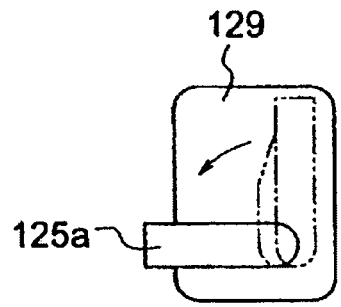
FIG. 5A is a schematic view illustrating an arrangement of the pair of clamping members according to a further embodiment of the present invention.
Figure 5A:
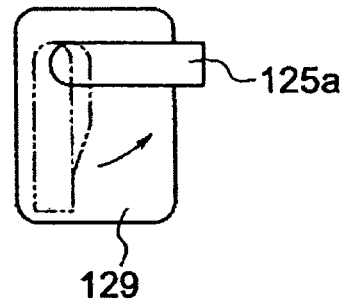
Figure 5B:
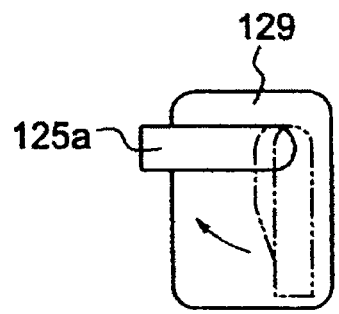
FIG. 5B is a schematic view illustrating an arrangement of the pair of clamping members according to a further embodiment of the present invention.
Figure 5B:
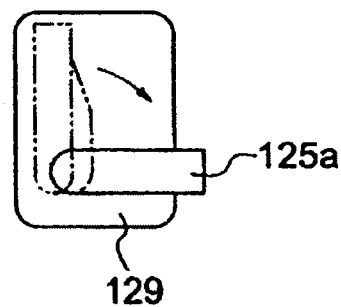

FIG. 5A illustrates a configuration in which the rotational direction of each clamping arm 125a is reversed. FIG. 5B illustrates a configuration in which the rotational axes "α" are situated farthest from each other in the arrangement of the housing depressions 129 illustrated in FIG. 5A. In those configurations, in a cross section of the housing depression 129 taken along a plane which includes the rotational axis "α" and is perpendicular to the bottom surface of the pod 2, one of the pair of clamping members 125 abuts against one of the opposing surfaces 2d to be clamped, and the other of the clamping members 125 abuts against the other of the surfaces 2d to be clamped. In those configurations, for example, in a case of a mechanism in which the clamping cylinders 125b perform only the pivoting operation, frictional forces are applied from the respective clamping portions 125c to the pod 2 in substantially opposite directions in the course of achieving the clamped state. Thus, it is possible to suppress the displacement of the pod 2 from the mount base 121 at the time of the clamping operation. However, in those configurations, the loads are applied from the respective clamping portions 125c to the surfaces 2d to be clamped at locations spaced apart from the above-mentioned center point of symmetry and in opposite directions. Thus, when a force for prompting the pod 2 to rotate about this center point is applied, there is a risk that an appropriate clamping effect cannot be obtained.

Figure 5C:
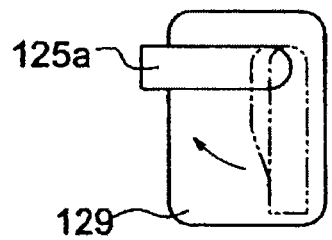
FIG. 5C is a schematic view illustrating an arrangement of the pair of clamping members according to a further embodiment of the present invention.
Figure 5C:
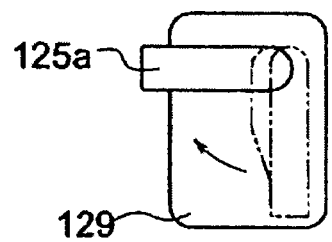
Figure 5D:
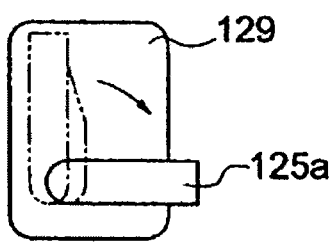
FIG. 5D is a schematic view illustrating an arrangement of the pair of clamping members according to a further embodiment of the present invention.
Figure 5D:
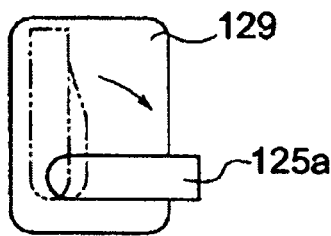

FIGS. 5C and 5D illustrate arrangements for effectively resisting the application of this rotational force. In the case of FIG. 5C, the surfaces 2d to be clamped are only the tapered surfaces on the door 111 side. Thus, strength is provided against the application of the above-mentioned rotational force or application of tension from a direction in which a transportation mechanism is arranged. In the case of FIG. 5D, the surfaces 2d to be clamped are only the tapered surfaces on a side opposite to the door 111. Thus, strength is provided against the application of the above-mentioned rotational force or application of tension from a direction of the door 111. However, the effect is decreased for application of the load from the opposite direction. Thus, it is preferred that those arrangements be selected appropriately in consideration of a usage environment of the load port apparatus 101, a restriction on the arrangement of the housing depressions 129 and the clamping cylinders 125b in the mount base 121, or the like.

As described hereinabove, the present invention relates to a load port apparatus used suitably with semiconductor processing apparatus. However, the present invention is applicable not only to the semiconductor processing apparatus but also to so-called load port apparatus used for various processing apparatus in which various processes conforming to those for semiconductors are performed, such as processing apparatus which handle panels for liquid crystal displays.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-166584, filed Jul. 29, 2011, which is hereby incorporated by reference herein in its entirety.

What is claimed is:

1. A load port apparatus, comprising:
a mount base on which a pod is to be fixed, the pod including a pod main body having an opening formed in one side surface thereof, and a lid for opening and closing the pod through the opening, the pod being capable of containing an object to be contained therein, the lid being openable and closable so that the object to be contained is insertable into and removable from the pod;
a clamping member including
(a) a clamping cylinder;
(b) a rod of which a first end is connected to the clamping cylinder, the rod having a pivot motion, between a retracting position at which the rod has a first length and a protruding position at which the rod is shortened to a second length that is less that the first length, about a rotational axis inclined at a predetermined angle relative to a bottom surface of the pod, and the rod has a further shortening after the pivot motion to move to a clamping position from the protruding position; and
(c) a clamping arm which is connected to a second end of the rod and includes a clamping portion abuttable against a portion to be clamped of the pod at the clamping position by the further shortening of the rod; and
a housing depression arranged in a surface of the mount base and having an internal space dimensioned so that when the rod is at the retracting position the clamping arm is housed in the housing depression and when the rod pivots in the pivot motion from the retracting position to the protruding position a part of the clamping arm protrudes above the mount base.

2. A load port apparatus according to claim 1, wherein the portion to be clamped comprises a depression provided in the bottom surface of the pod and opened at the bottom surface, and has a surface to be clamped, which gradually narrows an opening of the depression in a range from a bottom of the depression toward the opening of the depression, and
wherein the clamping portion has a shape conforming to a shape of the surface to be clamped.

3. A load port apparatus according to claim 1, wherein the clamping member comprises a pair of clamping members.

4. A load port apparatus according to claim 3, wherein, in a cross section of the housing depression taken along a plane which includes the rotational axis and is perpendicular to the bottom surface of the pod, one of the pair of clamping members abuts against one of opposing surfaces to be clamped, and another of the pair of clamping members abuts against another of the opposing surfaces to be clamped.

5. A load port apparatus according to claim 1, wherein the pivot motion of the rod pivots the clamping arm by 90°.

6. A clamping device to be used for a load port apparatus, the load port apparatus comprising a mount base on which a pod is to be fixed, the pod including a pod main body having an opening formed in one side surface thereof, and a lid for opening and closing the pod through the opening, the pod being capable of containing an object to be contained therein, the lid being openable and closable so that the object to be contained is insertable into and removable from the pod, the clamping device being configured to fix the pod onto the mount base, the clamping device comprising:
a clamping member including
(a) a clamping cylinder;
(b) a rod of which a first end is connected to the clamping cylinder, the rod having a pivot motion, between a retracting position at which the rod has a first length and a protruding position at which the rod is shortened to a second length that is less that the first length, about a rotational axis inclined at a predetermined angle relative to a bottom surface of the pod, and the rod has a further shortening after the pivot motion to move to a clamping position from the protruding position; and
(c) a clamping arm which is connected to a second end of the rod and includes a clamping portion abuttable against a portion to be clamped of the pod at the clamping position by the further shortening of the rod; and
a housing depression arranged in a surface of the mount base and having an internal space dimensioned so that when the rod is at the retracting position the clamping arm is housed in the housing depression and when the rod pivots in the pivot motion from the retracting position to the protruding position a part of the clamping arm protrudes above the mount base.

7. A clamping device according to claim 6,
wherein the portion to be clamped comprises a depression provided in the bottom surface of the pod and opened at the bottom surface, and has a surface to be clamped, which gradually narrows an opening of the depression in a range from a bottom of the depression toward the opening of the depression, and
wherein the clamping portion has a shape conforming to a shape of the surface to be clamped.

8. A clamping device according to claim 6, wherein the clamping member comprises a pair of clamping members.

9. A clamping device according to claim 8, wherein, in a cross section of the housing depression taken along a plane which includes the rotational axis and is perpendicular to the bottom surface of the pod, one of the pair of clamping members abuts against one of opposing surfaces to be clamped, and another of the pair of clamping members abuts against another of the opposing surfaces to be clamped.

10. A clamping device according to claim 6, wherein the pivot motion of the rod pivots the clamping arm by 90°.

* * * * *